(12) United States Patent
He et al.

(10) Patent No.: US 8,975,685 B2
(45) Date of Patent: Mar. 10, 2015

(54) N-CHANNEL MULTI-TIME PROGRAMMABLE MEMORY DEVICES

(75) Inventors: Yi He, Fremont, CA (US); Xiang Lu, Palo Alto, CA (US); Albert Bergemont, Palo Alto, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 88 days.

(21) Appl. No.: 13/600,792

(22) Filed: Aug. 31, 2012

(65) Prior Publication Data

US 2014/0063958 A1    Mar. 6, 2014

(51) Int. Cl.
*H01L 29/788*    (2006.01)

(52) U.S. Cl.
USPC .  257/315; 257/371; 365/185.18; 365/185.03; 365/185.05

(58) Field of Classification Search
USPC ................ 257/315, 371; 365/185.18, 185.03, 365/185.05
See application file for complete search history.

(56) References Cited

U.S. PATENT DOCUMENTS

| | | | |
|---|---|---|---|
| 5,953,255 A * | 9/1999 | Lee | 365/185.29 |
| 7,944,750 B1 | 5/2011 | Bergemont et al. | |
| 2013/0107635 A1* | 5/2013 | Fisch et al. | 365/185.33 |

OTHER PUBLICATIONS

Cho, Myung K., et al., "Simultaneous Hot-Hole Injection at Drain and Source for Efficient Erase and Excellent Endurance in SONOS Flash EEPROM Cells", *IEEE Electron Device Letters*, vol. 24, No. 4, (Apr. 2003), pp. 260-262.
Ielmini, Daniele , et al., "A Study of Hot-Hole Injection During Programming Drain Disturb in Flash Memories", *IEEE Transactions on Electron Devices*, vol. 53, No. 4, (Apr. 2006), pp. 668-676.
Palestri, P. , et al., "Cathode Hot Electrons and Anode Hot Holes in Tunneling MOS Capacitors", *Solid-State Device Research European Conference—ESSDERC 2000*, (2000), 4 pp. total.
Rakkhit, Rajat , et al., "Drain-Avalanche Induced Hole Injection and Generation of Interface Traps in Thin Oxide MOS Devices", *Reliability Physics Symposium, 1990, 28th Annual Proceedings*, New Orleans, LA, USA, (Mar. 27-29, 1990), pp. 150-153.
Yih, Cherng-Ming , et al., "Characterization of Hot-Hole Injection Induced SILC and Related Disturbs in Flash Memories", *IEEE Transactions on Electron Devices*, vol. 48, No. 2, (Feb. 2001), pp. 300-306.

* cited by examiner

*Primary Examiner* — Long Pham
(74) *Attorney, Agent, or Firm* — Blakely Sokoloff Taylor & Zafman LLP

(57) ABSTRACT

N-channel multi-time programmable memory devices having an N-conductivity type substrate, first and second P-conductivity type wells in the N-conductivity type substrate, N-conductivity type source and drain regions formed in the first P-conductivity type well, the source and drain regions being separated by a channel region, an oxide layer over the N-conductivity type substrate; and a floating gate extending over the channel region and over the second P-conductivity type well in the N-conductivity type substrate, the multi-time programmable memory cell being programmable by hot electron injection and erasable by hot hole injection.

8 Claims, 3 Drawing Sheets

N-CHANNEL MULTI-TIME PROGRAMMABLE MEMORY DEVICES

BACKGROUND OF THE INVENTION

1. Field of the Invention

The present invention relates to the field of multi-time programmable memories.

2. Prior Art

Multi-time programmable memories provide an excellent alternative to flash memory processes for embedding in integrated circuit designs that require only a fairly small number of memory bits, such as by way of example, 10 bits to 1K bits. Such memories may be used for various purposes, depending on the circuit, such as storing calibration or characterization information for the circuit in which they are embedded.

The advantage of multi-time programmable memory technology is that no extra process steps are needed in comparison to conventional CMOS processing, resulting in lower wafer cost. A multi-time programmable memory cell is bigger, about 10×, compared to a typical cell area for embedded flash memory. However, for a small memory capacity, the disadvantage of the larger cell size is more than offset by the absence of extra processing steps. Also a multi-time programmable memory offers superior bake retention characteristics: 125° C./10y vs. 85° C./10y for Flash depending on the configurations.

A multi-time programmable memory MTP can be used in two configurations, namely either an array mode with column and row decoders, or in a two cell differential form with access transistors (Acc Tr) for greater reliability margin.

U.S. Pat. No. 7,944,750, entitled "Multi-Programmable Non-Volatile Memory Cell" and owned by Maxim Integrated Products, Inc., assignee of the present invention, discloses a P-channel floating gate transistor with hot electron injection programming and Fowler-Nordheim tunneling erase. The cell does not require a control gate for the programming or erasing of the device. The memory device is comprised of two wells having an opposite conductivity type to the semiconductor body. In one of the wells is a source and drain well of the same conductivity type as the body. An oxide is formed on the surface of the body on which the floating gate is formed, with specific voltages being applied to various regions to program, erase and read the memory cell. That device used a 3.3 volt oxide. However such a device becomes difficult to implement for higher voltage oxides such as a 5 volt oxide, as the same would require in excess of 20 volts peak to peak to erase. Accordingly such a device becomes less attractive where higher voltage oxides must be used, such as a five volt oxide.

DETAILED DESCRIPTION OF THE PREFERRED EMBODIMENTS

The disadvantage of the P-channel multi-programmable memory cell of U.S. Pat. No. 7,944,750 described above is the erase voltage required, which only gets higher for thicker oxides such as a 5 volt oxide. Accordingly the present invention overcomes that disadvantage in an N-channel memory cell of the opposite conductivity type from that of the '750 patent, and with a different form of erase to avoid the high voltages required.

Figure 1:
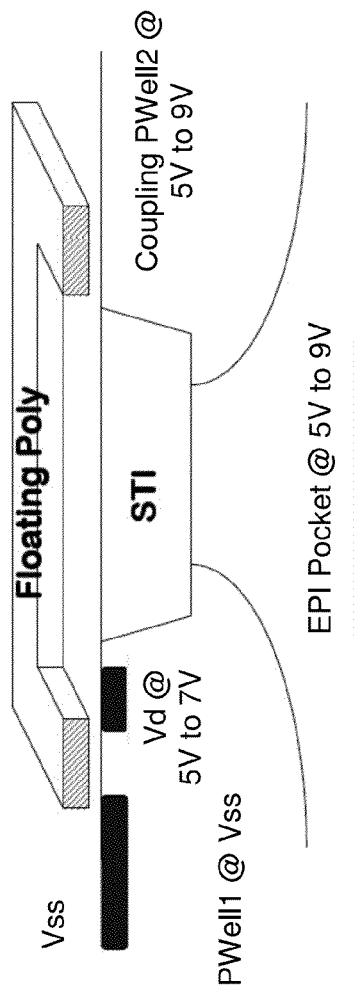
FIG. 1 is an exemplary schematic cross section through a memory cell showing exemplary voltages used for programming in accordance with the present invention.

Referring to FIG. 1, an exemplary cross section through a memory cell showing exemplary voltages used for programming in accordance with the present invention may be seen. The memory cell is fabricated in an N-type epi pocket or triple well (substrate) with a P-well identified as PWell1 at one side of the cell and a coupling well PWell2 (both wells being of P-conductivity type) at the other side of the cell, separated by a shallow trench isolation region (STI). N+ drain and N+ source regions (both source and drain regions being of N-conductivity type) are formed in PWell1 with a polysilicon floating gate over the channel region between the source and drain and extending over PWell2, and an oxide layer separating the floating gate from the channel and the coupling Pwell2.

Thus embodiments of the present invention physically may look similar to memory cells in accordance with the '750 patent, but with a reversal of conductivity types. In that regard, the polysilicon floating gate may take various physical shapes (planforms) providing it spans the channel region between the source and drain and that it extends to the coupling Pwell2, preferably over a shallow trench isolation STI.

Figure 2:
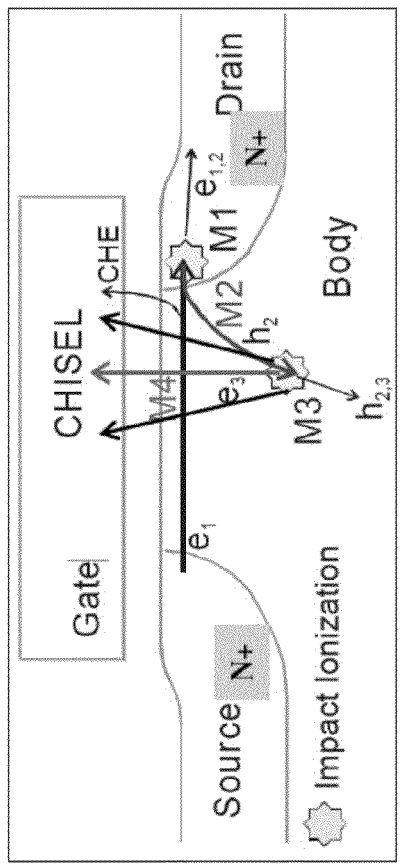
FIG. 2 schematically illustrates the programming mechanism of a memory cell in accordance with the present invention.

The N-channel memory device of the present invention, like that of the device of the '750 patent, uses hot electron injection programming as is well known in the art. For programming, the epi pocket and PWell2 are set at approximately 5 to 9 volts, the drain voltage is set at approximately 5 to 7 volts and the source voltage and Well1 are set at VSS (ground), as shown in FIG. 1. With these voltages, the channel is conducting. With the current pinching adjacent the drain, some electrons with sufficient kinetic energy (hot electrons) will overcome the silicon oxide barrier and become trapped in the polysilicon floating gate. The process is generally self regulating, in that as programming proceeds, the memory device will tend to turn off, decreasing the rate of generation of hot electrons. The programming mechanism is schematically illustrated in FIG. 2.

Figure 3:
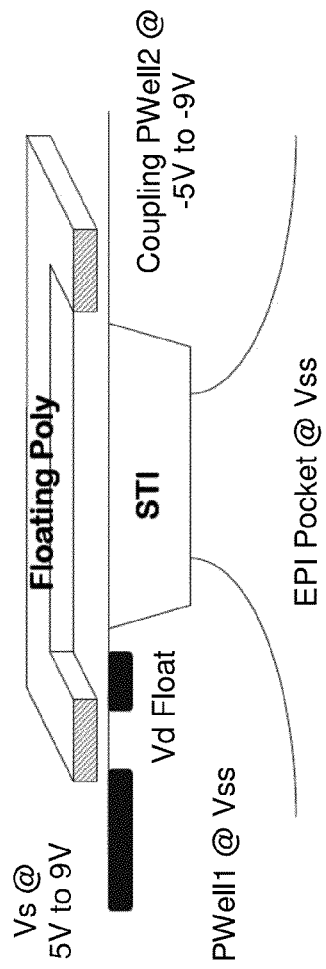
FIG. 3 is an exemplary schematic cross section through a memory cell showing exemplary voltages used for erasing the memory cell in accordance with the present invention.
Figure 4:
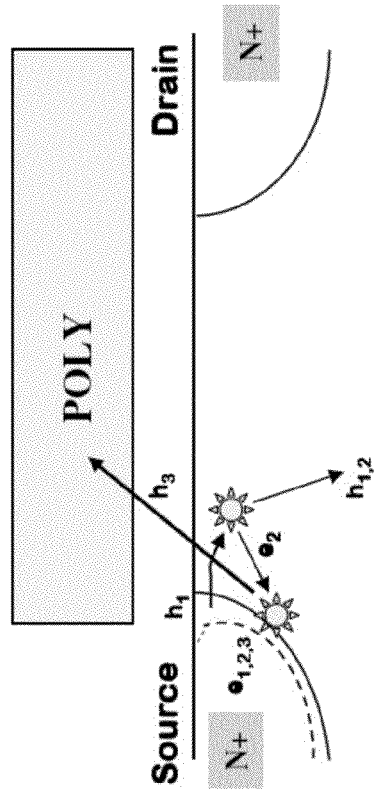
FIG. 4 schematically illustrates the erase mechanism of a memory cell in accordance with the present invention.

However unlike that of the device of the '750 patent, the N-channel device of the present invention uses hot hole injection erase. Hot holes are similar to hot electrons, the two generally or collectively being referred to in the literature as hot carriers. Hot holes are a product of voltage stressing. By applying that voltage stress across the gate oxide, the hot holes jump the oxide barrier from the source to the polysilicon floating gate, effectively cancelling or neutralizing the charge of the electrons added to the polysilicon floating gate during programming. To accomplish this band-to-band hot hole injection erase, the PWell1 and the epi pocket are set to VSS (ground), PWell2 is set to approximately −5 to −9 volts and either the source or drain voltage is set to approximately 5 to 9 volts, as shown in FIG. 3. The other node (either drain or source) is left floating. With the channel off, holes are generated by band-to-band tunneling in the source region. The holes create impact ionization (electron/hole pairs) in the channel region of PWell1. The capacitive coupling between PWell2 and the polysilicon floating gate had lowered the voltage on the polysilicon floating gate, which together with the high voltage on the source, causes a substantial voltage stress between the source and the polysilicon floating gate, driving holes to the gate to erase the cell. Again, the process tends to be self regulating, in that driving holes to the polysilicon floating gate tends to neutralize the negative charge on the polysilicon floating gate, decreasing the voltage stress that drives the hot holes to the polysilicon floating gate. This erase mechanism is schematically illustrated in FIG. 4. The specific voltages set forth herein for both programming and erasing are exemplary only, as the proper voltages will vary, depending on the oxide thickness, a thickness of more than 80 A being used in one embodiment to ensure retention.

For those that are troubled by the concept of tunneling of holes from the source to the polysilicon floating gate because a hole is the absence of something (the absence of an electron), as opposed to a real thing, like an electron, one can consider the hot hole injection erase mechanism to be the flow of electrons from the polysilicon floating gate to the source. This is because a hole tunneling to the polysilicon floating gate neutralizes the charge of an electron on the polysilicon floating gate and adds the charge of an electron to the source.

Figure 5:
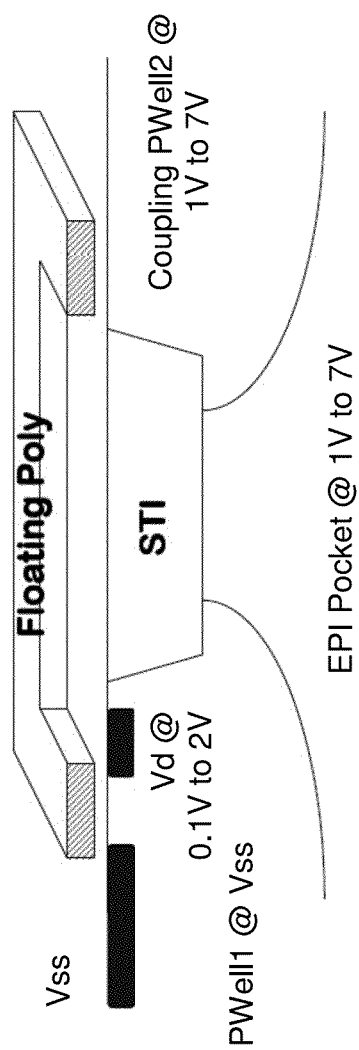
FIG. 5 schematically illustrates the read mechanism of a memory cell in accordance with the present invention.

The memory cells of the present invention may be read in a conventional manner, depending on whether used in an array mode with column and row decoders, or in a two cell differential form with Acc Tr for greater reliability margin. In a conventional Read operation, the epi pocket and PWell2 are biased at approximately 1 to 7 volts. The drain voltage is set at approximately 0.1 to 2 volts and the source voltage and PWell1 are set at Vss (ground), as shown in FIG. 5. With these voltages, when the memory device is erased, the channel is turned ON and channel current flows from drain to source. If the memory device is programmed, the channel is OFF and no current flows from drain to source. Thus, the memory characteristics are achieved. In a two cell differential form, two memory devices are always paired together to provide one bit of storage. Between the two devices, one is always programmed and the other one is always erased. The Read operation of a two cell differential form is identical to a conventional Read operation as both devices are biased together. The current difference between the paired memory device determines its memory state.

It should be noted for purposes of specificity and not by way of limitation, the source and drain regions have been specifically identified, though the position of the regions may be swapped, i.e., what is identified in the Figures as the source may be used as the drain and vice versa without departing from the present invention. Similarly, the voltages applied to the source and drain for reading, writing and erasing may be applied to either the source and drain respectively, or to the drain and source respectively.

While a preferred embodiment of the present invention has been disclosed and described herein for purposes of illustration and not for purposes of limitation, it will be understood by those skilled in the art that various changes in form and detail may be made therein without departing from the spirit and scope of the invention.

What is claimed is:

1. A method of programming and erasing an N-conductivity type multi-time programmable memory cell comprising:
    programming the multi-time programmable memory cell using hot electron injection; and,
    erasing the multi-time programmable memory cell using hot hole injection,
    wherein the method is practiced on a multi-time programmable memory cell comprising:
        an N-conductivity type substrate;
        first and second P-conductivity type wells in the N-conductivity type substrate;
        N-conductivity type source and drain regions formed in the first P-conductivity type well, the source and drain regions being separated by a channel region;
        an oxide layer over the N-conductivity type substrate; and
        a floating gate extending over the channel region and over the second P-conductivity type well in the N-conductivity type substrate.

2. The method of claim 1 wherein the multi-time programmable memory cell is erased by applying voltages as follows;
    to the substrate, a ground voltage;
    to the first P-conductivity type well, the ground voltage;
    to the second P-conductivity type well, a negative voltage;
    to the source or drain, a positive voltage;
    to the drain or source, no connection.

3. The method of claim 2 wherein the multi-time programmable memory cell is programmable by applying voltages as follows;
    to the substrate, a positive voltage;
    to the first P-conductivity type well, the ground voltage;
    to the second P-conductivity type well, a positive voltage;
    to the source or drain, the ground voltage;
    to the drain or source, a positive voltage.

4. The method of claim 3 wherein the multi-time programmable memory cell is readable by applying voltages as follows;
    to the substrate, a positive voltage;
    to the first P-conductivity type well, a positive voltage;
    to the second P-conductivity type well, a positive voltage;
    to the source or drain, a positive voltage;
    to the drain or source, the ground voltage.

5. The method of claim 2 wherein the values of the voltages are dependent on a thickness of the oxide layer.

6. A method of programming and erasing an N-conductivity type multi-time programmable memory cell having an N-conductivity type substrate, first and second P-conductivity type wells in the N-conductivity type substrate, N-conductivity type source and drain regions formed in the first P-conductivity type well, the source and drain regions being separated by a channel region, an oxide layer over the N-conductivity type substrate, and a floating gate extending over the channel region and over the second P-conductivity type well in the N-conductivity type substrate, the method comprising;
    programming the multi-time programmable memory cell using hot electron injection; and,
    erasing the multi-time programmable memory cell by applying voltages as follows;
    to the substrate, a ground voltage;
    to the first P-conductivity type well, the ground voltage;
    to the second P-conductivity type well, a negative voltage;
    to the source or drain, a positive voltage;
    to the drain or source, no connection;
    the values of the voltages being dependent on a thickness of the oxide layer.

7. The method of claim 6 wherein the multi-time programmable memory cell is programmable by applying voltages as follows;
    to the substrate, a positive voltage;
    to the source, a ground voltage;
    to the first P-conductivity type well, the ground voltage;
    to the second P-conductivity type well, a positive voltage;
    to the source, the ground voltage;
    to the drain, a positive voltage.

8. The method of claim 7 wherein the multi-time programmable memory cell is readable by applying voltages as follows;
to the substrate, a positive voltage;
to the first P-conductivity type well, a positive voltage;
to the second P-conductivity type well, a positive voltage;
to the source or drain, a positive voltage;
to the drain or source, the ground voltage.

\* \* \* \* \*